(12) United States Patent
Takeuchi (10) Patent No.: US 10,444,275 B2
(45) Date of Patent: Oct. 15, 2019

(54) ELECTRIC-CURRENT SENSING DEVICE, LOAD DRIVING SYSTEM, AND METHOD FOR MANUFACTURING ELECTRIC-CURRENT SENSING DEVICE

(71) Applicant: Renesas Electronics Corporation, Tokyo (JP)

(72) Inventor: Kenji Takeuchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 127 days.

(21) Appl. No.: 15/833,331

(22) Filed: Dec. 6, 2017

(65) Prior Publication Data

US 2018/0224495 A1 Aug. 9, 2018

(30) Foreign Application Priority Data

Feb. 7, 2017 (JP) .................................. 2017-020298

(51) Int. Cl.

| G01R 31/02 | (2006.01) |
|---|---|
| H01L 29/86 | (2006.01) |
| G01R 31/26 | (2014.01) |
| H01L 29/739 | (2006.01) |
| H01L 29/66 | (2006.01) |
| H01L 29/10 | (2006.01) |
| H01L 29/423 | (2006.01) |

(Continued)

(52) U.S. Cl.
CPC ......... *G01R 31/2608* (2013.01); *G01R 1/203* (2013.01); *H01L 29/0619* (2013.01); *H01L 29/1095* (2013.01); *H01L 29/4236* (2013.01); *H01L 29/66333* (2013.01); *H01L 29/66348* (2013.01); *H01L 29/7396* (2013.01); *H01L 29/7397* (2013.01); *H01L 29/0696* (2013.01)

(58) Field of Classification Search
CPC .............. G01R 31/2608; H01L 29/861; H01L 29/1095; H01L 29/0696; H01L 29/4236; H01L 29/7397; H01L 29/0834; H01L 29/0649

See application file for complete search history.

(56) References Cited

U.S. PATENT DOCUMENTS

| 2002/0153586 | A1* | 10/2002 | Majumdar | .......... H01L 29/7395 257/506 |
|---|---|---|---|---|
| 2009/0001411 | A1* | 1/2009 | Tokura | ................ H01L 27/0664 257/140 |

(Continued)

FOREIGN PATENT DOCUMENTS

JP 2015-153785 A 8/2015

*Primary Examiner* — Minh N Tang
(74) *Attorney, Agent, or Firm* — Mattingly & Malur, PC (57) ABSTRACT

There are provided an electric-current sensing device capable of detecting an electric current with high accuracy, a load driving system, and a method for manufacturing the electric-current sensing device. According to one embodiment, the electric-current sensing device includes a sense IGBT through which an electric current proportional to an electric current flowing through a main IGBT flows. Further, a depth of a P type floating region from a lower end of each of a plurality of trench gates provided in the sense IGBT is shallower than a depth of another P type floating region from a lower end of each of a plurality of trench gates provided in the main IGBT.

12 Claims, 7 Drawing Sheets

(51) Int. Cl.
  *H01L 29/06* (2006.01)
  *G01R 1/20* (2006.01)

(56) References Cited

U.S. PATENT DOCUMENTS

2013/0248924 A1* 9/2013 Matsudai ............ H01L 29/7397
  257/139
2016/0372584 A1 12/2016 Kimura et al.

* cited by examiner

FIG. 1
SYS1

ELECTRIC-CURRENT SENSING DEVICE, LOAD DRIVING SYSTEM, AND METHOD FOR MANUFACTURING ELECTRIC-CURRENT SENSING DEVICE

CROSS-REFERENCE TO RELATED APPLICATIONS

The disclosure of Japanese Patent Application No. 2017-020298 filed on Feb. 7, 2017 including the specification, drawings and abstract is incorporated herein by reference in its entirety.

BACKGROUND

The present invention relates to an electric-current sensing device, a load driving system, and a method for manufacturing the electric-current sensing device and, for example, it relates to an electric-sensing device, a load driving system, and a method for manufacturing the electric-current sensing device, which is suitable for detecting an electric current with high accuracy.

For example, in the load driving system which drives loads such as a motor etc. of an automobile, there is provided an electric power converting device (inverter) which converts an electric power supplied by a power supply source from a direct current to an alternating current by a PWM (pulse width modulation) control. Through a switching operation of a power transistor such as an IGBT (Insulated Gate Bipolar Transistor), the inverter converts the direct-current power supplied by the power supply source to a pulse signal. Then, the inverter generates an alternating-current signal of amplitude and a frequency corresponding to a pulse-width of the pulse signal.

In this regard, when a large current flows, the power transistor such as the IGBT may generate heat exceeding a tolerance. The over-heat of the power transistor causes characteristic variation and lifetime reduction of the power transistor itself. Therefore, detecting an over-current flowing through the power transistor and protecting the power transistor from overheating is requested.

A solution for such a request is disclosed, for example, in Patent Document 1. A semiconductor device disclosed in Patent Document 1 includes: a main IGBT and a sense IGBT through which an electric current smaller than an electric current flowing through the main IGBT flows, where the electric current flowing through the main IGBT is detected by detecting the electric current which flows through the sense IGBT.

PATENT DOCUMENT

[Patent Document 1] Japanese Unexamined Patent Application Publication No. 2015-153785

SUMMARY

In an IGBT which has a trench configuration, an emitter electrode is arranged over a surface of a cell arranging region formed over a semiconductor substrate. However, there is a case where there is provided a region (emitter electrode non-arranging region), as an adjusting margin, where the emitter electrode is not arranged on purpose.

In the IGBT of the above configuration, however, in a drift region under a region where the emitter electrode is not arranged, electrons do not spread sufficiently and a balance between the electrons and holes would be lost. Therefore, the IGBT of the above configuration had a problem of being unable to operate with high accuracy. As a result, for example, an electric-current sensing device, which detects an electric current flowing through a detection object based on an electric current flowing through the IGBT of the above configuration, was unable to detect the electric current with high accuracy.

Other problems and new features would be made clear from the description of Specification and the attached drawings.

According to one embodiment, an electric-current sensing device has a sense IGBT through which an electric current proportional to an electric current flowing through a main IGBT flows. The sense IGBT includes: a drift region of a first conductive type provided in a semiconductor substrate; a buffer layer of a first conductive type provided adjacent to the drift region on one surface side of the semiconductor substrate; a collector layer of a second conductive type provided adjacent to the buffer layer; a plurality of first trench gates provided in such a way that they extend from the other surface of the semiconductor substrate to the inside of the drift region; an emitter region of a first conductive type provided in some part between the first trench gates; a channel region of a second conductive type provided between the emitter region and the drift region in the some part between the first trench gates; and a first floating region of a second conductive type provided in the other part between the first trench gates. Further, a depth of the first floating region from a lower end of each of the first trench gates provided in the sense IGBT is shallower than a depth of a second floating region from a lower end of each of a plurality of second trench gates provided in the main IGBT.

According to another embodiment, a method for manufacturing an electric-current sensing device includes the steps of forming a sense IGBT through which an electric current proportional to an electric current flowing through a main IGBT flows. In forming the sense IGBT, the method further includes the steps of; forming a drift region of a first conductive type in a semiconductor substrate; forming a buffer layer of a first conductive type adjacent to the drift region on one surface side of the semiconductor substrate; forming a collector layer of a second conductive type adjacent to the buffer layer; forming a plurality of first trench gates in such a way that they extend from the other surface of the semiconductor substrate to the inside the drift region; forming an emitter region of a first conductive type in some part between the first trench gates; forming a channel region of a second conductive type between the emitter region and the drift region in the some part between the first trench gates; and forming a first floating region of a second conductive type in the other part between the first trench gates. Also, in forming the sense IGBT, a depth of the first floating region from the lower end of each of the first trench gates provided in the sense IGBT is made shallower than a depth of a second floating region from a lower end of each of a plurality of second trench gates provided in the main IGBT.

According to one embodiment described above, there are provided an electric-current sensing device capable of detecting an electric current in a high precision, a load driving system, and a method for manufacturing the electric-current sensing device.

BRIEF DESCRIPTION OF THE DRAWINGS

FIG. 4A to FIG. 4J illustrate methods for manufacturing trench gates of the main IGBT and the sense IGBT, respectively;

DETAILED DESCRIPTION

Embodiments of the present invention will be described below with reference to the accompanying drawings. Note that the drawings are in simplified form, and the technical scope of the embodiment should not be interpreted to be limited to the drawings. The same elements are denoted by the same reference numerals, and a duplicate description is omitted.

In the following embodiments, when necessary, the present invention is explained by using separate sections or separate embodiments. However, those embodiments are not related with each other, unless otherwise specified. That is, they are related in such a manner that one embodiment is a modified example, an application example, a detailed example, or a supplementary example of a part of the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number bases on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

Figure 1:
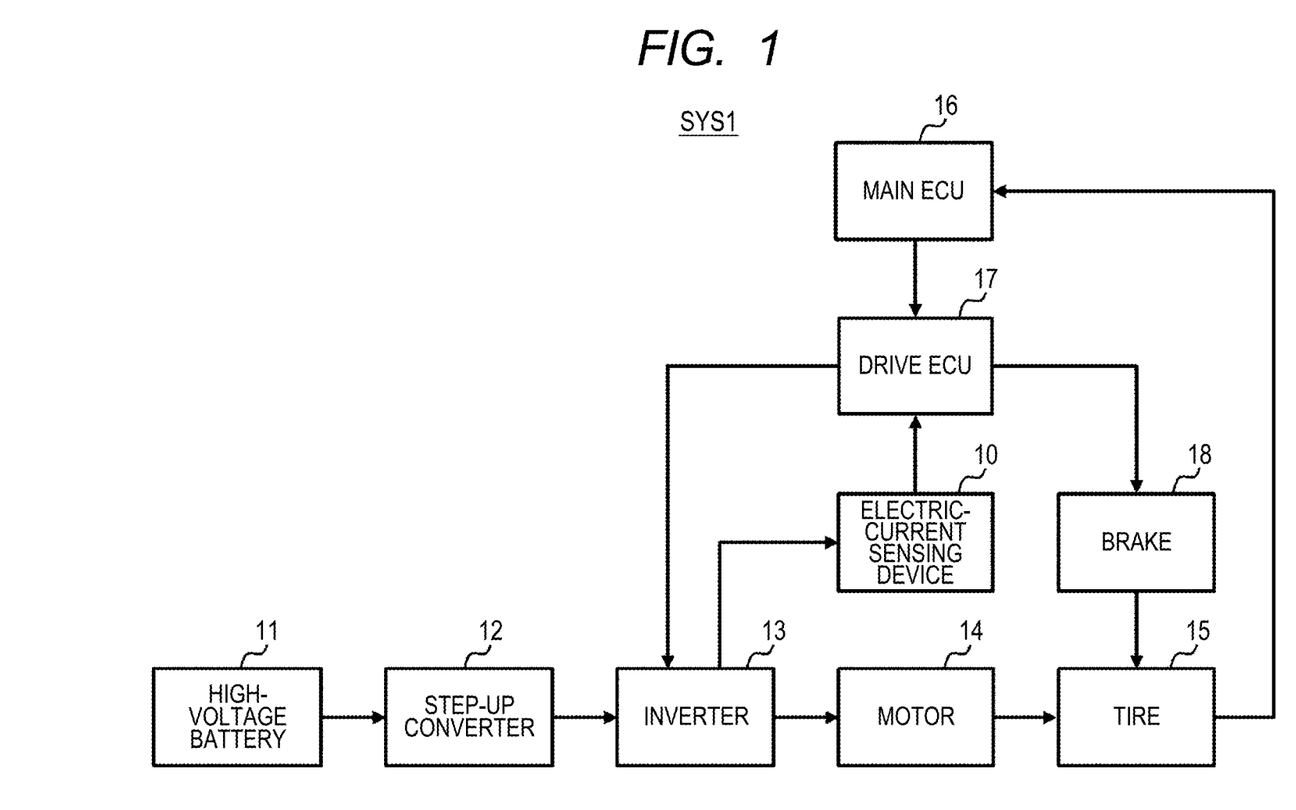
FIG. 1 is a diagram showing a configuration example of a load driving system in which an electric-current sensing device according to First Embodiment is installed.

FIG. 1 is a diagram showing a configuration of a load driving system SYS1 in which an electric-current sensing device according to First Embodiment is installed. The load driving system SYS1 is, for example, a system which drives loads, such as a motor of an automobile etc.

As shown in FIG. 1, the load driving system SYS1 includes: a high-voltage battery (power supply source) 11; a step-up converter 12; an inverter 13; a main ECU (electronic control unit) 16 that is a control part; a drive ECU17; a brake 18; and an electric-current sensing device 10. In addition, a motor 14 and tires 15 which are loads are also shown in FIG. 1.

The high-voltage battery 11 outputs an electric power of a high voltage. The step-up converter 12 boosts a voltage level of an electric power outputted from the high-voltage battery 11 to a level sufficient to drive the motor 14. In addition, the step-up converter 12 may not be provided if it is unnecessary.

The inverter 13 converts the electric power boosted by the step-up converter 12 into an alternating current from a direct current by a (PWM) pulse width modulation control. Specifically, the inverter 13 includes a main IGBT (Insulated Gate Bipolar Transistor) 200 and, by a switching operation of the main IGBT (200), converts the direct-current power supplied by the power supply source to a pulse signal. The inverter 13 further generates an alternating-current signal of amplitude and a frequency corresponding to a pulse-width of the pulse signal. The motor 14 is rotated by the alternating-current signal (for example, a three-phase alternating current), and the tire 15 is rotated by the rotation of the motor 14.

Based on a pedal manipulation by an operator and rpm of the tire 15 etc., the main ECU 16 gives an instruction to the drive ECU 17 to execute a predetermined processing etc. The drive ECU 17 executes the predetermined processing based on the instruction from the main ECU 16. Specifically, based on the instruction from the main ECU 16, the drive ECU 17 controls the rotational frequency of the motor 14, drives the brake 18, and so on.

In addition, when controlling the rotational frequency of the motor 14, by adjusting switching timing of the main IGBT 200 installed in the inverter 13, the drive ECU 17 adjusts the pulse-width of the pulse signal and, thereby, controls the amplitude and frequency of the alternating-current signal. As a result, the rotational frequency of the motor 14 is controlled to a desired rotational frequency.

In this regard, when a large current flows, the main IGBT 200 provided in the inverter 13 may generate heat exceeding a tolerance. The overheating of the main IGBT 200 causes characteristic variation and lifetime reduction of the main IGBT 200 itself. Therefore, according to the present embodiment, the main IGBT 200 is protected from overheating by detecting an over-current flowing through the main IGBT 200 with use of the electric-current sensing device 10.

The electric-current sensing device 10 detects the over-current which flows through the main IGBT 200 provided in the inverter 13, and outputs the detection result to the drive ECU 17. For example, the electric-current sensing device 10 includes: a sense IGBT 100 through which an electric current proportional to an electric current (for example, about 1/1000 of the electric current) which flows through the main IGBT 200 flows; and an electric-current calculating part which calculates an electric current flowing through the main IGBT 200 based on the electric current flowing through the sense IGBT 100.

For example, the drive ECU 17 performs control operation such as stopping the drive of the motor 14 by the inverter 13 etc. when it detects that an over-current is flowing in the main IGBT 200 by the detection result of the electric-current sensing device 10.

(Details of Main IGBT 200 and Sense IGBT 100)

Next, the main IGBT 200 and the sense IGBT 100 will be explained in detail.

Figure 2:
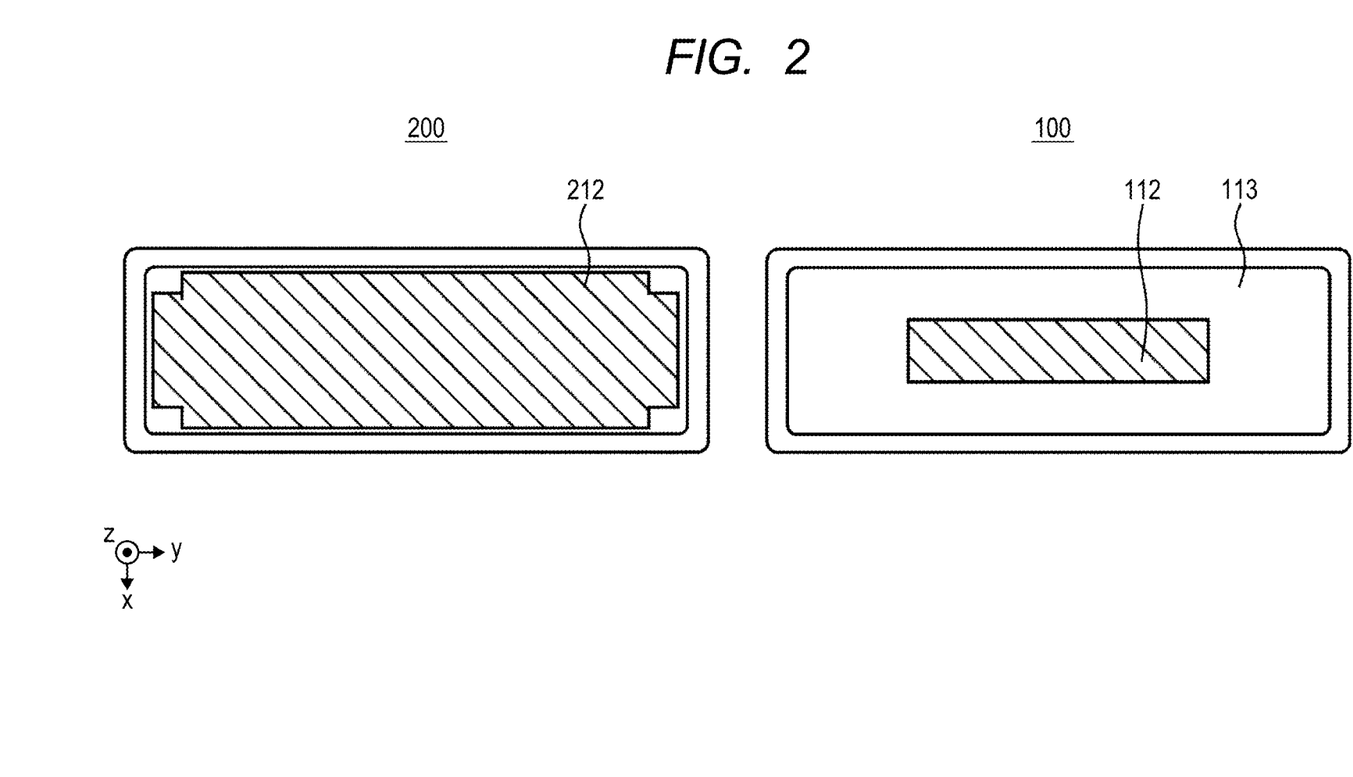
FIG. 2 is a diagram schematically showing planar configurations of the main IGBT and the sense IGBT, respectively.

First, referring to FIG. 2, planar configurations of the main IGBT 200 and the sense IGBT 100 will be explained, respectively. FIG. 2 is a diagram schematically showing the planar configurations of the main IGBT 200 and the sense IGBT 100, respectively.

As shown in FIG. 2, the emitter electrodes 212 is arranged widely over a surface of a cell arranging region of the main IGBT 200. On the other hand, the emitter electrode 112 is arranged in a central part over a surface of a cell arranging region of the sense IGBT 100. However, the emitter electrode 112 is not arranged in a peripheral region thereof. Hereafter, the region where the emitter electrode 112 is not arranged is called an "emitter electrode non-arranging region 113."

In this regard, by newly arranging an emitter electrode 112 in the emitter electrode non-arranging region 113 and increasing the emitter electrode arranging region or reducing the arranging region of the emitter electrode 112, it is possible to adjust a ratio of currents (sense ratio) which flow through the main IGBT 200 and the sense IGBT 100, respectively. As a result, an error in the sense ratio can be rectified or the sense ratio can be changed according to a specification.

Figure 3:
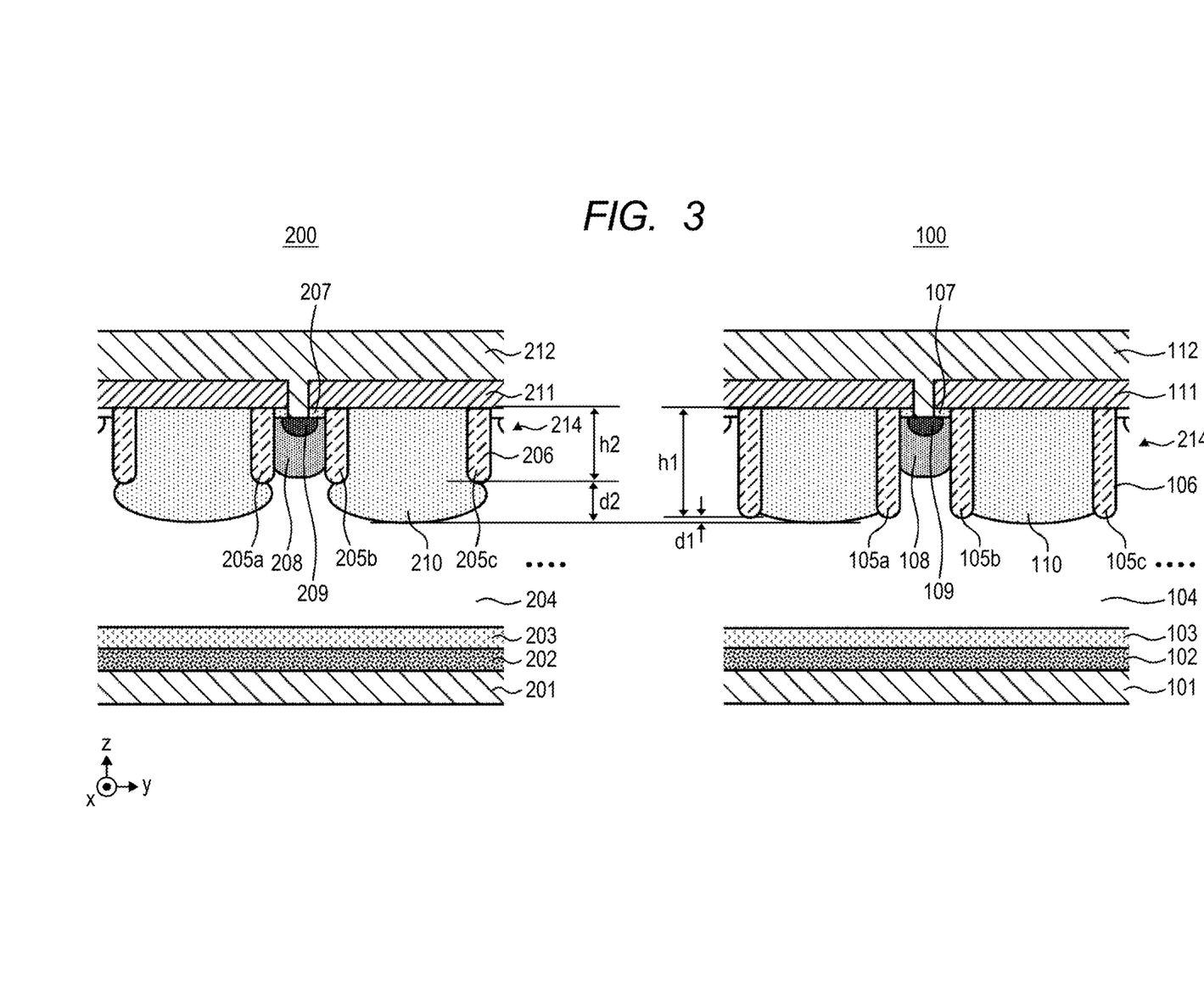
FIG. 3 is a diagram schematically showing sectional configurations of the main IGBT and the sense IGBT, respectively.

Next, referring to FIG. 3, sectional configurations of the main IGBT 200 and the sense IGBT 100 will be explained, respectively. FIG. 3 is a diagram schematically showing the sectional configurations of the main IGBT 200 and the sense IGBT 100, respectively. Further, in the present embodiment, a case where the main IGBT 200 and the sense IGBT 100 are formed over the same semiconductor substrate will be explained, which is not limitative. That is, the main IGBT 200 and the sense IGBT 100 may be provided over separate semiconductor substrates.

(Sectional Configuration of Main IGBT 200)

As shown in FIG. 3, in the main IGBT 200, an N⁻ type drift region 204 is formed in a semiconductor substrate 214.

An N type buffer layer 203 and a P type collector layer 202 are formed sequentially in one surface (lower surface in the drawing) of the semiconductor substrate 214. A layer of a collector electrode 201 is further formed in a surface of the P type collector layer 202.

A cell arranging region is formed over the other surface (upper surface in the drawing) of the semiconductor substrate 214. Specifically, a plurality of trench gates 205 (trench gates 205a to 205c in FIG. 3) which extend perpendicularly in an N⁻ type drift region 204 from the other surface of the semiconductor substrate 214 are provided on the other surface side of the semiconductor substrate 214. Each of the trench gates 205 is used as a gate electrode, and a surface thereof is covered with a gate insulating film 206. Hereafter, the trench gate 205 is also called a "gate electrode 205."

In some part between the trench gates 205 (in this example, sandwiching a portion where a P type floating region 210 is formed, alternately), an N type emitter region 207 is formed. Also, a p type channel region 208 is provided between the N type emitter region 207 and the N− type drift region 204. Moreover, a P type contact region 209 is formed within the P type channel region 208. However, the P type contact region 209 may not be provided.

In the other part between the trench gates 205 (in this example, alternately), a P type floating region 210 is provided. When an N⁻ type drift region 204 is formed in a formation region thereof, the P type floating region 210 is provided for preventing an unintended electric current from flowing.

Also, in the example of FIG. 3, the N type emitter region 207, the P type channel region 208, and the P type contact region 209 are provided between the trench gates 205a and 205b. Moreover, the P type floating region 210 is provided between the trench gates 205b and 205c.

Furthermore, a layer of an emitter electrode 212 is formed over the other surface of the semiconductor substrate 214 via an isolating layer 211. A plurality of through holes are provided in the isolating layer 211, and the emitter electrode 212 is coupled to the N type emitter region 207 and the P type contact region 209 via the through hole.

Incidentally, the P type floating region 210 further expands from a lower end the trench gate 205 toward the N⁻ type drift region 204 side and covers most of the lower end portion of the trench gate 205. As a result, electric field concentration on the lower end of the trench gate 205 is eased and a withstand voltage of the IGBT 200 is improved. Accordingly, for example, since the N⁻ type drift region 204 can be made thinner without lowering the withstand voltage of the IGBT 200, on-resistance of the IGBT 200 can be made small.

(Operation of Main IGBT 200)

Next, an operation of the main IGBT 200 will be explained. A supply voltage of positive polarity is supplied to the collector electrode 201, and the load is coupled to the emitter electrode 212.

If a voltage of an L level is applied to the gate electrode 205, holes (positive holes) gather in the P type channel region 208. Therefore, between the P type channel region 208 and the N⁻ type drift region 204, there is formed a PN-junction diode having a directional characteristic which is opposite to an electric current direction of an electric current path which can be formed from the collector electrode 201 to the emitter electrode 212. As a result, there flows no electric current from the collector electrode 201 to the emitter electrode 212. That is, when the voltage of the L level is applied to the gate electrode 205, the IGBT 200 is turned off.

On the other hand, when a voltage of an H level is applied to the gate electrode 205, in the P type channel region 208, there is formed a channel region whose type is inverted to N by electronic induction. Therefore, an N type channel region in the P type channel region 208, the N⁻ type drift region 204, and the N type buffer layer 203 are conducted as the same electrically conductive types. Moreover, between the N type buffer layer 203 and the P type collector layer 202, there is formed a PN-junction diode of the same direction (forward direction) as the direction of an electric current of the electric-current path which can be formed from the collector electrode 201 to the emitter electrode 212. As a result, an electric current flows into the emitter electrode 212 from the collector electrode 201 through the P type collector layer 202, the N type buffer layer 203, the N⁻ type drift region 204, the N type channel region in the P type channel region 208, and the N type emitter region 207. That is, when the voltage of the H level is applied to the gate electrode 205, the IGBT 200 is turned on. In addition, according to the level of the voltage applied to the gate electrode 205, the value of the electric current which flows into the IGBT 200 changes.

(Sectional Configuration of Sense IGBT 100)

As shown in FIG. 3, in a sense IGBT 100, like the case of the main IGBT 200, an N⁻ type drift region 204 is formed in a semiconductor substrate 214.

An N type buffer layer 103 and a P type collector layer 102 are formed sequentially over one surface (lower surface in the drawing) of the semiconductor substrate 214. A layer of the collector electrode 101 is further formed over the P type collector layer 102.

A cell arranging region is formed over the other surface (upper surface in the drawing) of the other side of the semiconductor substrate 214. Specifically, a plurality of trench gates 105 (trench gates 105a to 105c in FIG. 3) which extend perpendicularly to an N⁻ type drift region 104 from the other surface of the semiconductor substrate 214 are provided on the other surface side of the semiconductor substrate 214. Each trench gate 105 is used as a gate electrode, and a surface thereof is covered with a gate insulating film 106. Hereafter, the trench gate 105 is also called a "gate electrode 105".

In some part between the trench gates 105 (in this example, sandwiching a portion where a P type floating region 110 is formed, alternately), an N type emitter region 107 is provided and, at the same time, a P type channel region 108 is formed between the N type emitter region 107 and the N⁻ type drift region 104. Moreover, a P type contact region 109 is formed inside a P type channel region 108. However, the P type contact region 109 may not be formed.

In the other part between the trench gates 105 (in this example, alternately), a P type floating region 110 is provided. When the N⁻ type drift region 104 is formed in a formation region of the P type floating region 110, the P type floating region 110 is provided for preventing an unintended electric current from flowing.

In addition, in the example shown in FIG. 3, the N type emitter region 107, the P type channel region 108, and the P type contact region 109 are formed between the trench gates 105a and 105b. Moreover, the P type floating region 110 is formed between the trench gating 105b and 105c.

Further, over the other surface of the semiconductor substrate 214, a layer of an emitter electrode 112 is formed via an isolating layer 111. A plurality of through holes are provided in the isolating layer 111, and the emitter electrode 112 is coupled to the N type emitter region 107 and the P type contact region 109 via the through holes.

In this regard, as described above, over the surface of the cell arranging region of the sense IGBT, there exists an emitter electrode non-arranging region 113 where the emitter electrode 112 is not arranged. Under the emitter electrode non-arranging region 113, a MOSFET operation is not performed. However, in order to allow the MOSFET to operate normally under the emitter electrode arranging region 112, the balance between the holes and electrons in the N⁻ type drift region 104 should be kept at a constant level.

However, when the P type floating region 110 expands further from the lower end of the trench gate 105 toward the N⁻ type drift region 104 side, the expanded portion serves as a barrier and it will disturb a transverse mobility (in Y axis direction) of the electrons in the N⁻ type drift region 104. In particular, in the N⁻ type drift region 104 under the emitter electrode non-arranging region 113 distant from the emitter electrode arranging region 112, the electrons do not reach there and a hole-accumulation layer is formed. As a result, the balance between the holes and the electrons is lost in the N⁻ type drift region 104 under the emitter electrode non-arranging region 113. Therefore, the sense IGBT 100 cannot operate with high accuracy and, as a result, the electric-current sensing device 10 may be unable to detect an electric-current at a desired sense ratio with high accuracy.

Therefore, according to the present embodiment, part of the p type floating region 110 expanding from the lower end of the trench gate 105 toward the N⁻ type drift region 104 side is made small. Specifically, a depth h1 of the trench gate 105 which extends inwardly from the surface of the semiconductor substrate 214 is made deeper than a depth h2 of the trench gate 205 which extends inwardly from the surface of the semiconductor substrate 214. In this way, the depth d1 of the P type floating region 110 from the lower end of the trench gate 105 is made shallower than the depth d2 of the P type floating region 210 from the lower end of the trench gate 205.

Thus, in the N⁻ type drift region 104, the barrier of the P type floating region 110 becomes small and it becomes easier for the electrons to move in a transverse direction. Accordingly, also in the N⁻ type drift region 104 under the emitter electrode non-arranging region 113, the balance between the holes and the electrons can be kept at the constant level. Therefore, the sense IGBT 100 can operate with high accuracy and, as a result, the electric-current sensing device 10 can detect the electric current at a desired sense ratio with high accuracy.

(Operation of Sense IGBT 100)

Next, an operation of the sense IGBT 100 will be explained. Also, in the sense IGBT 100, for example, an electric current of 1/1000 of the sense ratio of the main IGBT 200 flows in the sense IGBT 100.

For example, when the voltage of the L level is applied to the gate electrode 105, holes (positive holes) may gather in the P type channel region 108. Therefore, between the P type channel region 108 and the N⁻ type drift region 104, there is formed a PN-junction diode having a directional characteristic which is opposite to an electric current direction of an electric-current path which can be formed from the collector electrode 101 to the emitter electrode 112. As a result, there flows no electric current from the collector electrode 101 to the emitter electrode 112. That is, when the voltage of the L level is applied to the gate electrode 105, the IGBT 100 is turned off.

On the other hand, when the voltage of the H level is applied to the gate electrode 105, a channel region whose type is inverted to N by electronic induction is formed in the P type channel region 108. As a result, an N type channel region in the P type channel region 108, the N⁻ type drift region 104, and the N type buffer layer 103 are conducted as the same electrically conductive types. Moreover, between the N type buffer layer 103 and the P type collector layer 102, there is formed a PN-junction diode of the same direction (forward direction) as the direction of the electric current of the electric-current path which can be formed from the collector electrode 101 to the emitter electrode 112. Therefore, an electric current flows into the emitter electrode 112 from the collector electrode 101 through the P type collector layer 102, the N type buffer layer 103, the N⁻ type drift region 104, the N type channel region in the P type channel region 108, and the N type emitter region 107. That is, when the voltage of the H level is applied to the gate electrode 105, the IGBT 100 is turned on.

In this regard, the voltage of the same level as that of the gate electrode 205 is applied to the gate electrode 105. As a result, an electric current which is proportional to an electric current (in this example, 1/1000 of the electric current) flowing in the main IGBT 200 flows in the sense IGBT 100.

(Method for Manufacturing Main IGBT 200 and Sense IGBT 100)

Next, with reference to FIG. 4A to FIG. 4J, methods for manufacturing trench gates of the main IGBT 200 and the sense IGBT 100, respectively, will be explained. FIG. 4A to FIG. 4J are diagrams for explaining the methods for manufacturing trench gates of the main IGBT 200 and the sense IGBT 100, respectively.

First, an oxide film 222 and a photo-resist 223 are formed sequentially over a surface of a silicon substrate 221 (equivalent to the semiconductor substrate 214). Then, exposure and development are performed. In this way, the pattern of the trench gates 205 of the main IGBT 200 is formed over the photo-resist 223. Specifically, a plurality of openings for forming the trench gates 205 are formed in the photo-resist 223 (refer to FIG. 4A).

Subsequently, dry etching is performed. As a result, a plurality of openings are formed by the corrosion in a region of an oxide film 222 exposed through the openings formed in the photo-resist 223 (refer to FIG. 4B).

Subsequently, the remaining photo-resist 223 is removed. As a result, only the oxide film 222 having the openings formed by the corrosion remains in a surface of a silicon substrate 221 (refer to FIG. 4C).

Figure 4A:
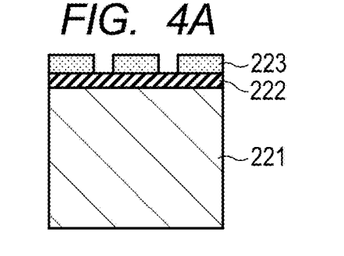
Figure 4B:
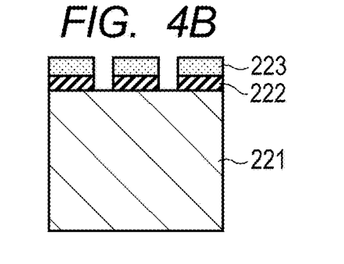
Figure 4C:
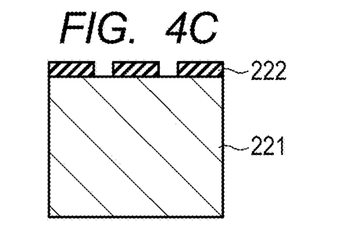
Figure 4D:
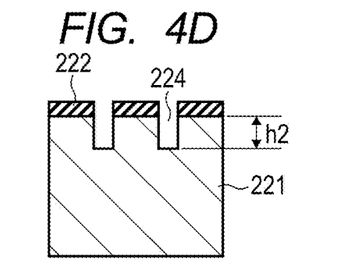

Subsequently, silicon etching is performed. As a result, a plurality of concave portions 224 of a depth h2 are formed by the corrosion in the surface of the silicon substrate 221 exposed through the openings formed in the oxide film 222 (refer to FIG. D).

Figure 4E:
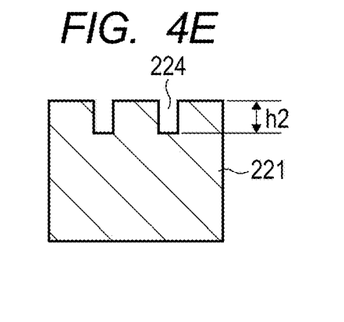
Figure 4F:
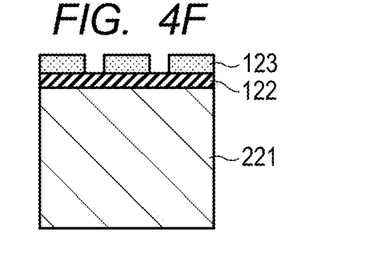
Figure 4G:
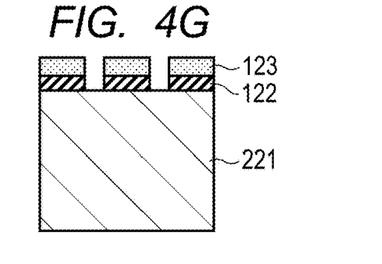
Figure 4H:
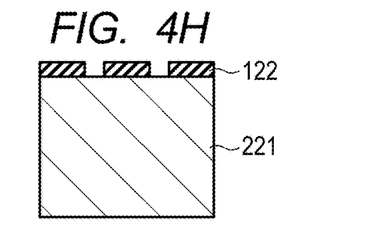
Figure 4I:
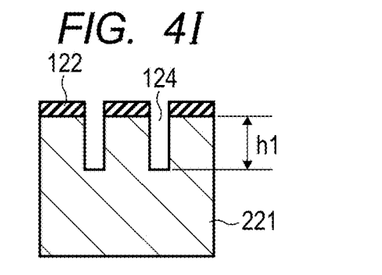

Subsequently, the remaining oxide film 222 is removed (refer to FIG. 4E). The concave portions 224 formed in the surface of the silicon substrate 221 serve as formation regions for the trench gates 205 of the main IGBT 200.

Subsequently, an oxide film 122 and a photo-resist 123 are formed sequentially in the surface of the silicon substrate 221 (equivalent to the semiconductor substrate 214). Then, exposure and development are performed. As a result, a pattern of the trench gates 105 of the sense IGBT 100 is formed in the photo-resist 123. Specifically, a plurality of openings for forming the trench gates 105 are formed in the photo-resist 123 (refer to FIG. 4F).

Subsequently, dry etching is performed. As a result, a plurality of openings is formed by the corrosion in a region of an oxide film 122 exposed through the openings formed in the photo-resist 123 (refer to FIG. 4G).

Subsequently, the remaining photo-resist 123 is removed. As a result, only the oxide film 122 having the openings formed by the corrosion remains in the surface of the silicon substrate 221 (refer to FIG. 4H).

Subsequently, silicon etching is performed. As a result, a plurality of concave portions 124 of a depth h1 which is deeper than the depth h2 is formed by the corrosion in the surface of the silicon substrate 221 exposed through the openings formed in the oxide film 122 (refer to FIG. 4I).

Figure 4J:
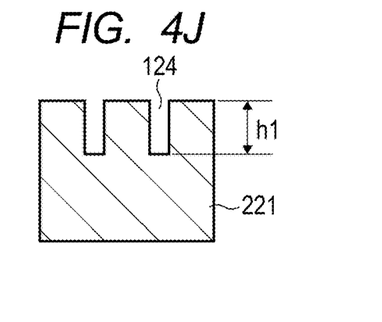

Subsequently, the remaining oxide film 122 is removed (refer to FIG. 4J). The concave portions 124 formed in the surface of the silicon substrate 221 serve as formation regions for the trench gates 105 of the sense IGBT 100.

Subsequently, after several manufacturing processes, in some part between the concave portions 224 (some part between the trench gate 205) and some part between the concave portions 124 (some part between the trench gates 105), P type floating regions 210 and 110 are formed, respectively.

In this regard, since the P type floating regions 210 and 110 are simultaneously formed in the same manufacturing process, the depths of the P type floating regions 210 and 110 from the substrate surface are substantially the same. On the other hand, the concave portion 224 of the trench gate 205 and the concave portion 124 of the trench gate 105 are formed with different depths h2 and h1 (h2<h1) in different manufacturing processes, respectively. Therefore, the depth d1 of the P type floating region 110 from the lower end of the trench gate 105 in the sense IGBT 100 can be made shallower than the depth d2 of the P type floating region 210 from the lower end of the trench gate 205 in the main IGBT 200. That is, in the N⁻ type drift region 104 of the sense IGBT 100, the barrier of the P type floating region 110 can be made small.

Thus, the electric-current sensing device 10 according to the present embodiment includes the sense IGBT 100 through which the electric current proportional to the electric current flowing through the main IGBT 200 flows. Further, the depth d1 of the P type floating region 110 from the lower end of the trench gate 105 in the sense IGBT 100 is made shallower than the depth d2 of the P type floating region 210 from the lower end of the trench gate 205 in the main IGBT 200.

As a result, in the electric-current sensing device 10 according to the present embodiment, it becomes easier for the electrons to move inside the N⁻ type drift region 104 in the sense IGBT 100. As a result, the balance between the holes and the electrons can be kept at the constant level also in the N⁻ type drift region 104 under the region where the emitter electrode 112 is not arranged. Therefore, the sense IGBT 100 can operate with high accuracy and, as a result, the electric-current sensing device 10 can detect an electric current at a desired sense ratio with high accuracy.

(Result of Experiment)

Figure 5:
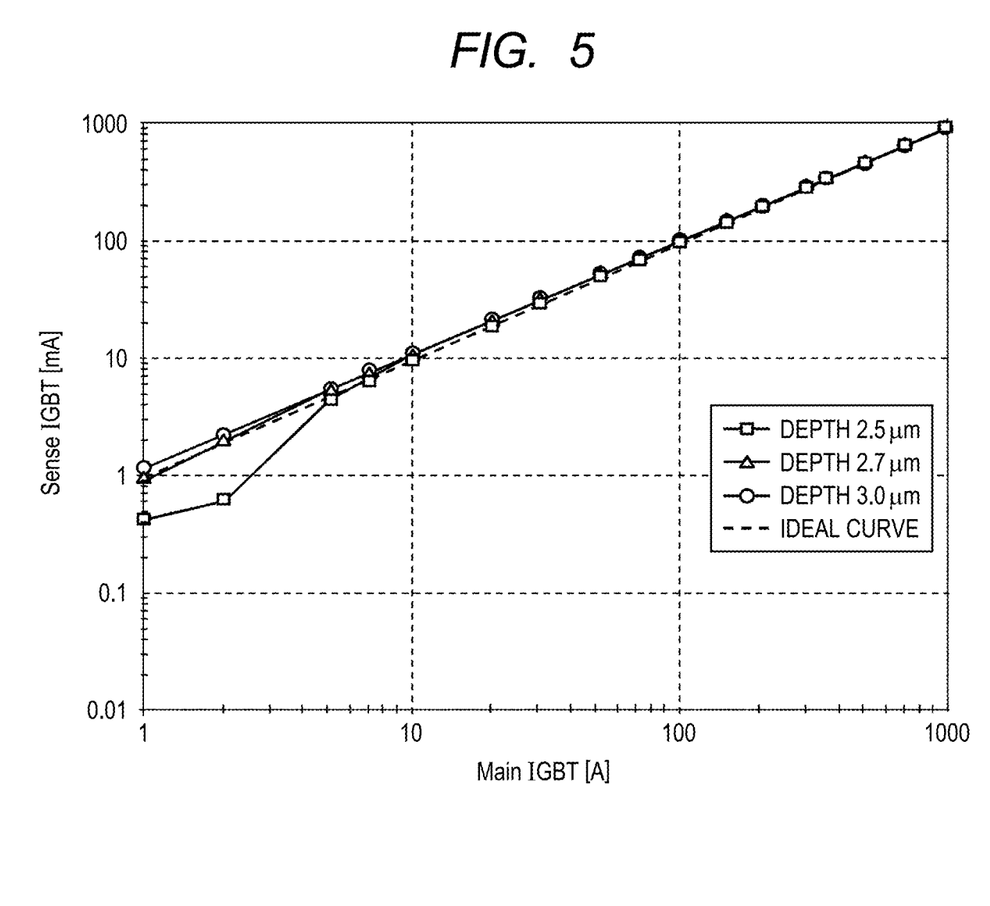
FIG. 5 is a diagram for showing a relationship of electric currents, according to depths of the trench gates, flowing through the main IGBT and the sense IGBT, respectively.

FIG. 5 is a diagram for showing a relationship of electric currents, according to depths of the trench gates, flowing through the main IGBT and the sense IGBT, respectively. In addition, the dashed line shown in FIG. 5 indicates an ideal state where a ratio (sense ratio) of the electric currents which flow through the main IGBT 200 and the sense IGBT 100 is set to 1000 to 1.

As shown in FIG. 5, for example, when the depth of the trench gate is 2.5 μm, the P type floating region expands greatly from the lower end of the trench gate toward the N⁻ type drift region side, causing a difference in sense ratio. On the contrary, when the depth of the trench gate is 2.7 μm or greater, the P type floating region does not expand greatly from the lower end of the trench gate toward the N⁻ type drift region side. Therefore, it is seen that the difference in sense ratio has become negligibly small.

Further, the deeper the trench gate is, the less the P type floating region expands toward the side of the N⁻ type drift region of the P type floating region and the difference in sense ratio becomes smaller. However, in this case, a switching characteristic of the IGBT tends to be deteriorated. Therefore, in the present embodiment, the trench gate of the main IGBT 200 requiring high-speed operation is not made deep, and only the trench gate of the sense IGBT 100 is made deep.

In the present embodiment, the description has been made assuming that the depth d1 of the P type floating region 110 from the lower end of the trench gate 105 in the sense IGBT 100 is greater than zero, which is not limitative. Needless to say, the depth d1 of the P type floating region 110 from the lower end of the trench gate 105 in the sense IGBT 100 may be zero or smaller. That is, the P type floating region 110 may not expand from the lower end of the trench gate 105 toward the N⁻ type drift region 104 side. In such a case, however, it should be noted that the lower end of the trench gate 105 is not covered with the P type floating region 110, the electrical field concentrates on the lower end of the trench gate 105 and, as a result, the withstand voltage of the sense IGBT 100 may be lowered. Hereafter, the explanation thereof will be given briefly using FIG. 6.

(Relation Between Depth d1 and VCES Withstand Voltage)

Figure 6:
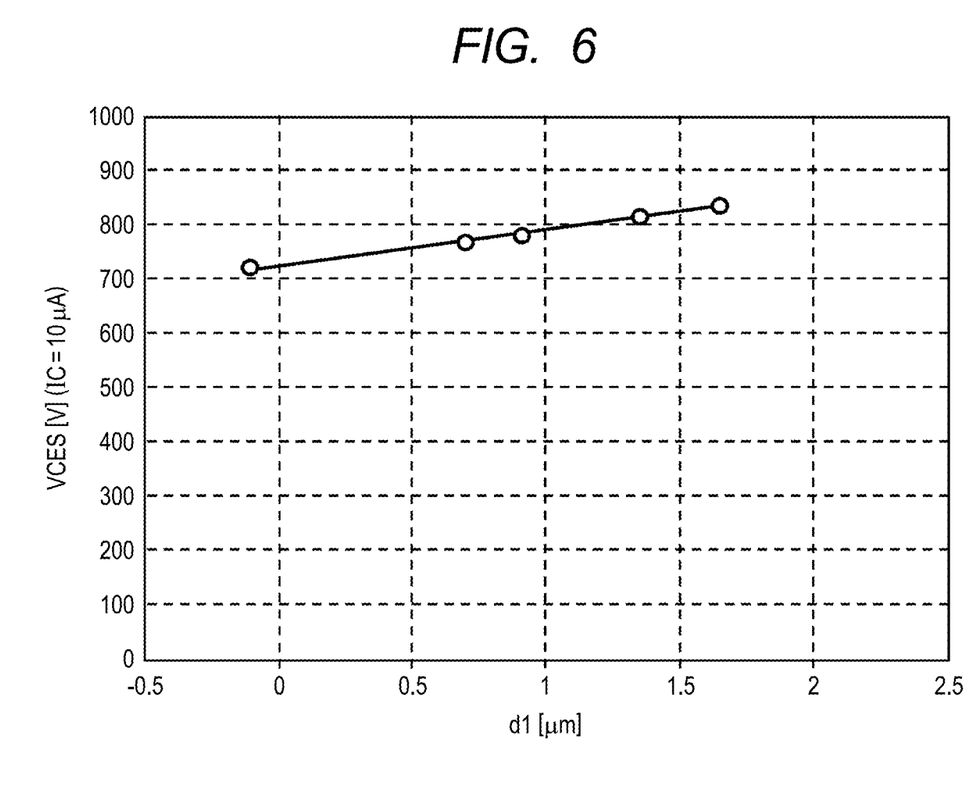
FIG. 6 is a diagram showing a relationship of a difference between the depth of the trench gates and a depth of a P type floating region and a VCES withstand voltage.

FIG. 6 is a diagram showing a relation between the depth d1 of the P type floating region 110 from the lower end of the trench gate 105 and a VCES withstand voltage (withstand voltage between a collector and an emitter). As shown in FIG. 6, the shallower the depth d1 is, the smaller the VCES withstand voltage becomes. Accordingly, it is seen that when the depth d1 becomes shallow, the lower end of the trench gate 105 is not covered with the P type floating region 110, the electric field concentrates on the lower end of the trench gate 105 and, as a result, the VCES withstand voltage of the sense IGBT 100 falls.

(Modification of Main IGBT 200 and Sense IGBT 100)

Figure 7:
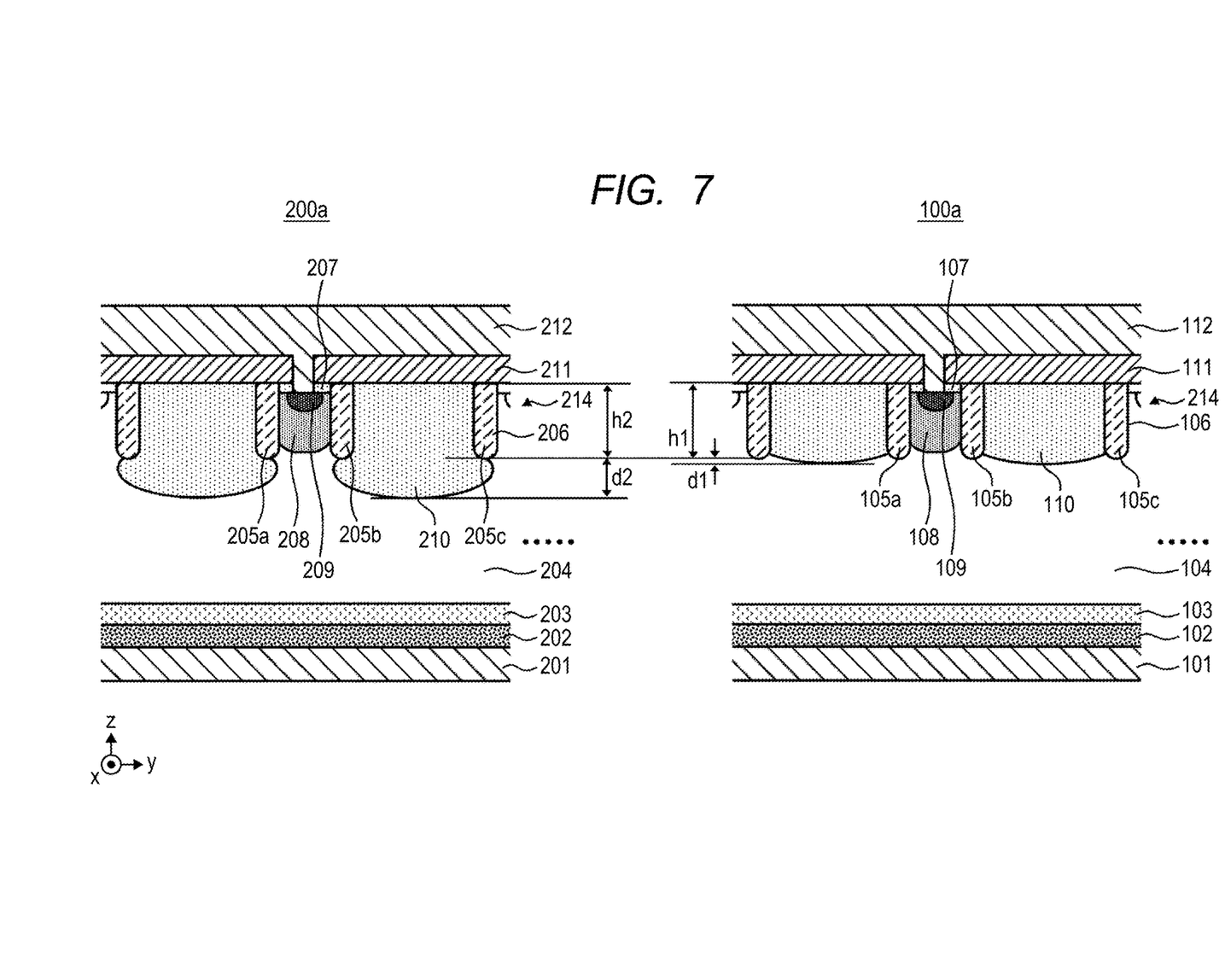
FIG. 7 is a diagram showing modifications of the sectional configurations of the main IGBT and the sense IGBT, respectively.

FIG. 7 is a diagram showing modification examples of sectional configurations of the main IGBT 200 and the sense IGBT 100, respectively, as a main IGBT 200a and a sense IGBT 100a.

In the main IGBT 200 and the sense IGBT 100, the depths of the P type floating regions 210 and 110 from the substrate surface are made substantially the same and the depths of the trench gates 205 and 105 from the substrate surface are made different. On the other hand, in the main IGBT 200a and the sense IGBT 100a, the depths of the trench gates 205 and 105 from the substrate surface are made substantially the same and the depths of the P type floating regions 210 and 110 from the substrate surface are made different.

Since other configurations of the main IGBT 200a and the sense IGBT 100a are similar to those of the main IGBT 200 and the sense IGBT 100, the explanations thereof will be omitted.

In the case of the main IGBT 200a and the sense IGBT 100a, it becomes possible to make the depth d1 of the P type floating region 110 from the lower end of the trench gate 105 in the sense IGBT 100 shallower than the depth d2 of the P type floating region 210 from the lower end of the trench gate 205 in the main IGBT 200. That is, in the N⁻ type drift region 104 of the sense IGBT 100, the barrier of the P type floating region 110 can be made small.

As a result, in the electric-current sensing device 10a according to the modification of the present embodiment, it becomes easy for electrons to move inside the N⁻ type drift region 104 in the sense IGBT 100a, allowing the balance between the holes and the electrons to be kept at the constant level also in the N⁻ type drift region 104 under the region where the emitter electrode 112 is not arranged. Therefore, the sense IGBT 100a can operate with high accuracy, and, as a result, the electric-current sensing device 10a can detect an electric current at a desired sense ratio with high accuracy.

As has been described, the electric-current sensing device according to the above embodiment includes the sense IGBT through which the electric current proportional to the electric current which flows through the main IGBT flows. Further, the depth d1 of the P type floating region from the lower end of the trench gate in the sense IGBT is made shallower than the depth d2 of the P type floating region from the lower end of the trench gate in the main IGBT.

Consequently, in the electric-current sensing device according to the above embodiment, it becomes easy for the electrons to move inside the N⁻ type drift region in the sense IGBT, allowing the balance between the holes and the electrons to be kept at the constant level also in the N⁻ type drift region under the region where the emitter electrode is not arranged. Therefore, the sense IGBT can operate with high accuracy and, as a result, the electric-current sensing device can detect the electric-current at the desired sense ratio with high accuracy.

The present invention has been specifically described based on the above embodiments. However, the present invention is not limited to the embodiments and various modifications can be accomplished in a range not apart from the scope of the present invention.

For example, in the above embodiment, the example has been described as to the sense ratio of 1/1000, which is not limitative. That is, the sense ration can be set to any value.

Moreover, for example, in the semiconductor device according to the above embodiment, there may be adopted a configuration where conductive types (p type or n type) of the semiconductor substrate, semiconductor layer, diffusion layer (diffusion region), etc. are inverted. Accordingly, when one of the n type and the p type serves as a first conductive type and the other one of them serves as a second conductive type, the first conductive type can be the p type and the second conductive type can be the n type. Alternatively, the first conductive type can be the n type and the second conductive type can be the p type.

What is claimed is:

1. An electric-current sensing device, comprising:
a sense IGBT through which an electric current proportional to an electric current flowing through a main IGBT flows,
wherein the sense IGBT includes:
a drift region of a first conductive type provided in a semiconductor substrate;
a buffer layer of a first conductive type provided adjacent to the drift region on one surface side of the semiconductor substrate;
a collector layer of a second conductive type provided adjacent to the buffer layer;
a plurality of first trench gates formed in such a way that they extend from the other surface of the semiconductor substrate to the inside of the drift region;
an emitter region of a first conductive type provided in some part between the first trench gates;
a channel region of a second conductive type provided between the emitter region and the drift region in the some part between the first trench gates; and
a first floating region of a second conductive type provided in the other part between the first trench gates, and
wherein a depth of the first floating region from a lower end of each of the first trench gates provided in the sense IGBT is shallower than a depth of a second floating region from a lower end of each of a plurality of second trench gates provided in the main IGBT.

2. The electric-current sensing device according to claim 1, wherein the sense IGBT is formed together with the main IGBT in the semiconductor substrate.

3. The electric-current sensing device according to claim 1, further comprising an electric-current calculating part for calculating, based on an electric current flowing through the sense IGBT, an electric current flowing through the main IGBT.

4. The electric-current sensing device according to claim 1, wherein the sense IGBT further includes, over the other surface of the semiconductor substrate, an emitter electrode partially covering the trench gates.

5. The electric-current sensing device according to claim 1,
wherein a depth of the first floating region provided in the sense IGBT is substantially the same as a depth of the second floating region provided in the main IGBT, and
wherein a depth of the first trench gates provided in the sense IGBT is deeper than a depth of the second trench gates provided in the main IGBT.

6. The electric-current sensing device according to claim 5, wherein a depth of the first floating region provided in the sense IGBT is shallower than the depth of each of the first trench gates provided in the sense IGBT.

7. The electric-current sensing device according to claim 1,
wherein a depth of the first trench gates provided in the sense IGBT is substantially the same as a depth of the second trench gates provided in the main IGBT, and
wherein the depth of the first floating region provided in the sense IGBT is shallower than the depth of the second floating region provided in the main IGBT.

8. A load driving system, comprising:
a power supply source;
a main IGBT provided between the power supply source and a load;
the electric-current sensing device according to claim 1 which detects an over-current flowing through the main IGBT and;
a control part which controls turning on and off of the main IGBT based on a detection result obtained by the electric-current sensing device.

9. A method for manufacturing an electric-current sensing device, comprising the steps of forming a sense IGBT through which an electric current proportional to an electric current flowing through a main IGBT flows,
wherein, in forming the sense IGBT, the method further comprises the steps of;
forming a drift region of a first conductive type in a semiconductor substrate;
forming a buffer layer of a first conductive type adjacent to the drift region on one surface side of the semiconductor substrate;
forming a collector layer of a second conductive type adjacent to the buffer layer;
forming a plurality of first trench gates in such a way that they extend from the other surface of the semiconductor substrate to the inside of the drift region;
forming an emitter region of a first conductive type in some part between the first trench gates;
forming a channel region of a second conductive type between the emitter region and the drift region in the some part between the first trench gates;
forming a first floating region of a second conductive type in the other part between the first trench gates, and
wherein, in forming the sense IGBT, a depth of the first floating region from a lower end of each of first the trench gates provided in the sense IGBT is made shallower than a depth of a second floating region from a lower end of each of a plurality of second trench gates provided in the main IGBT.

10. The method for manufacturing an electric-current sensing device according to claim 9,
wherein a depth of the first floating region provided in the sense IGBT is made substantially the same as a depth of the second floating region provided in the main IGBT, and
wherein a depth of the first trench gates provided in the sense IGBT is made deeper than a depth of the second trench gates provided in the main IGBT.

11. The method for manufacturing an electric-current sensing device according to claim 10, wherein a depth of the first floating region provided in the sense IGBT is made shallower than a depth of each of the first trench gates provided in the sense IGBT.

12. The method for manufacturing an electric-current sensing device according to claim 9,
wherein a depth of each of the first trench gates provided in the sense IGBT is made substantially the same as the depth of the second trench gates provided in the main IGBT, and
wherein a depth of the first floating region provided in the sense IGBT is made shallower than a depth of the second floating region provided in the main IGBT.

* * * * *